United States Patent
Hamada (10) Patent No.: US 10,367,036 B2
(45) Date of Patent: Jul. 30, 2019

(54) ORGANIC LIGHT-EMITTING STRUCTURE AND DISPLAY DEVICE

(71) Applicant: Shanghai Tianma AM-OLED Co., Ltd., Shanghai (CN)

(72) Inventor: Yuji Hamada, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 15/786,978

(22) Filed: Oct. 18, 2017

(65) Prior Publication Data
US 2018/0358416 A1    Dec. 13, 2018

(30) Foreign Application Priority Data
Jun. 13, 2017   (CN) .......................... 2017 1 0443761

(51) Int. Cl.
| | |
|---|---|
| H01L 27/32 | (2006.01) |
| H01L 51/52 | (2006.01) |
| H01L 51/50 | (2006.01) |

(52) U.S. Cl.
CPC ........ *H01L 27/3213* (2013.01); *H01L 27/322* (2013.01); *H01L 27/3218* (2013.01); *H01L 27/3262* (2013.01); *H01L 51/504* (2013.01); *H01L 51/5206* (2013.01); *H01L 51/5234* (2013.01); *H01L 2251/558* (2013.01)

(58) Field of Classification Search
None
See application file for complete search history.

(56) References Cited

U.S. PATENT DOCUMENTS

| | | | |
|---|---|---|---|
| 2013/0082589 A1* | 4/2013 | So ...................... | H01L 51/5036 |
| | | | 313/504 |
| 2016/0104749 A1 | 4/2016 | Tsuji et al. | |
| 2016/0359121 A1 | 12/2016 | Ito et al. | |

FOREIGN PATENT DOCUMENTS

| | | |
|---|---|---|
| CN | 106674026 A | 5/2017 |

OTHER PUBLICATIONS

Chinese Office Action for corresponding Chinese Application Serial No. 201710443761.8, dated Jul. 25, 2018, pp. 1-15.

* cited by examiner

*Primary Examiner* — Michelle Mandala
(74) *Attorney, Agent, or Firm* — Tarolli, Sundheim, Covell & Tummino LLP (57) ABSTRACT

An organic light-emitting structure is described herein. The organic light emitting structure includes a first light-emitting unit, a second light-emitting unit, a third light-emitting unit, and a fourth light-emitting unit. An emission wavelength of the first light-emitting unit, an emission wavelength of the second light-emitting unit, an emission wavelength of the third light-emitting unit, and an emission wavelength of the fourth light-emitting unit successively increase. Each of a luminous efficiency of the second light-emitting unit, and a luminous efficiency of the third light-emitting unit is greater than each of a luminous efficiency of the first light-emitting unit and a luminous efficiency of the fourth light-emitting unit. The color gamut range of the organic light-emitting structure is increased, the color saturation of the light-emitting device is improved, and quantity of colors is increased, so that the development trend of color reproducibility for the display devices can be satisfied.

11 Claims, 2 Drawing Sheets

| 600 |
|---|
| 713 |
| 712 |
| 711 |
| 710 |
| 709 |
| 708 |
| 707 |
| 706 |
| 705 |
| 704 |
| 500 |

FIG. 3

ORGANIC LIGHT-EMITTING STRUCTURE AND DISPLAY DEVICE

CROSS-REFERENCE TO RELATED APPLICATIONS

The present application claims the benefit of priority to Chinese Patent Application No. 201710443761.8, filed on Jun. 13, 2017, the content of which is incorporated herein by reference in its entirety.

TECHNICAL FIELD

The present disclosure relates to the field of display technologies and, particularly, to an organic light-emitting structure, and a display device.

BACKGROUND

An organic light-emitting diode (Organic Light-Emitting Diode, OLED) can be used as a light source for a display device or for a lighting device, which has advantages of wide view angle, short response time, small thickness, light weight, and ability of bending at any angles.

An OLED light emitting device includes an active-matrix organic light emitting diode (AMOLED) and a passive-matrix organic light emitting diode (PMOLED). When compared with PMOLED, AMOLED has advantages of low energy consumption, high resolution, fast response, and other advantageous photoelectric properties, which gradually becomes a mainstream technology of OLED display.

Traditional AMOLED light emitting devices generally consist of RGB (three primary colors), and use RGB to realize full-color images. However, a color gamut range of the three primary colors of RGB is limited, resulting in a poor color saturation, which contributes to a reduced color quantity of the AMOLED light emitting devices. Accordingly, the AMOLED light emitting devices are unable to meet a development demands on color reproducibility for all kinds of the display devices.

SUMMARY

The present disclosure provides an organic light-emitting structure, and a display device, to solve the above-mentioned problems.

A first aspect of the present disclosure provides an organic light-emitting structure, including: a first light-emitting unit, a second light-emitting unit, a third light-emitting unit, and a fourth light-emitting unit, wherein each of the first light-emitting unit, the second light-emitting unit, the third light-emitting unit, and the fourth light-emitting unit comprises a first electrode, a second electrode, and an organic laminated body placed between the first electrode and the second electrode, and one of the first electrode and the second electrode is a translucent electrode; an emission wavelength of the first light-emitting unit, an emission wavelength of the second light-emitting unit, an emission wavelength of the third light-emitting unit, and an emission wavelength of the fourth light-emitting unit successively increase; and each of a luminous efficiency of the second light-emitting unit and a luminous efficiency of the third light-emitting unit is greater than each of a luminous efficiency of the first light-emitting unit and a luminous efficiency of the fourth light-emitting unit.

A second aspect of the present disclosure provides a display device, including the organic light-emitting structures as described above.

It should be understood that, the general description as above and the detailed description hereinafter are exemplary, and they do not limit the present disclosure.

REFERENCE SIGNS

100—first light-emitting unit
101—first light-emitting layer
102—first monochromic hole transmission layer
200—second light-emitting unit
201—second light-emitting layer
202—second monochromic hole transmission layer
300—third light-emitting unit
301—third light-emitting layer
302—third monochromic hole transmission layer
400—fourth light-emitting unit
401—fourth light-emitting layer
202—fourth monochromic hole transmission layer
500—first electrode
600—second electrode
701—common hole injection layer
702—common hole transmission layer
703—common electron transmission layer
704—hole injection layer
705—first hole transmission layer
706—blue-light emitting layer
707—first electron transmission layer
708—N-type charge generation layer
709—P-type charge generation layer
710—second hole transmission layer
711—yellow-light emitting layer
712—second electron transmission layer
713—electron injection layer
714—light filter
800—substrate
900—light extraction layer
150—thin film transistor
151—active layer
152—source electrode
153—drain electrode
154—gate electrode
155—first insulation film
160—second insulation film
170—third insulation film
171—fourth insulation film
180—first planarization film
190—second planarization film The above-mentioned drawing is incorporated into the specification and constitutes a part of the specification, which shows embodiments according to the present disclosure, and is used for illustrating principles of the present disclosure.

DESCRIPTION OF EMBODIMENTS

The present disclosure is described in detail as below with reference to the accompanying drawings. It should be appreciated that nouns of locality, such as "above", "below", "left", "right", etc., used in the embodiments of the present disclosure are described in an angle shown in the figures, and are not intended to limit the present disclosure. In addition, in the context, it should be appreciated that when a member is formed "on" or "below" another member, the member is not only formed directly "on" or "below" another member, but also formed indirectly "on" or "below" another member by an intermediate member.

Figure 1:
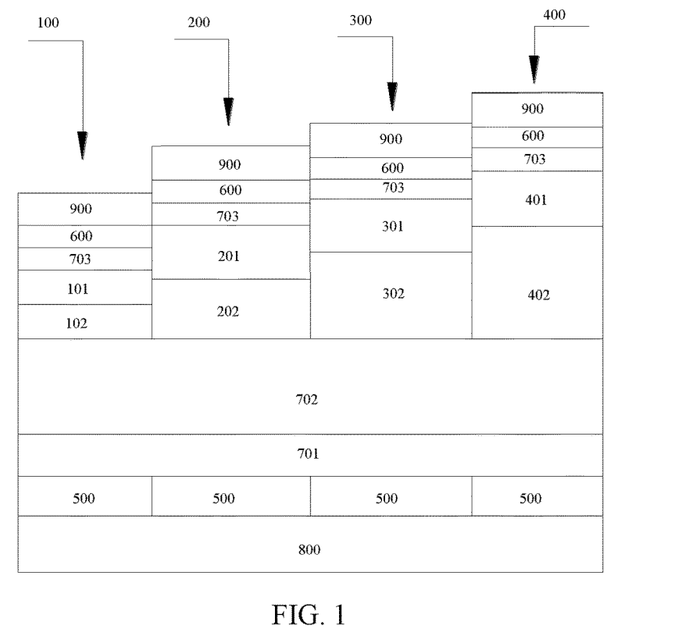
FIG. 1 illustrates a structural schematic diagram of an organic light-emitting structure according to an embodiment of the present disclosure.

As shown in FIG. 1, an embodiment of the present disclosure provides an organic light-emitting structure that can be applied in AMOLED to increase the color gamut range of the AMOLED. Hereinafter, the expression form "light-emitting structure" generally means a structure that emits a light, and the expression form "organic light-emitting structure" generally means an organic structure that emits a light. The organic light-emitting structure includes a first light-emitting unit 100, a second light-emitting unit 200, a third light-emitting unit 300, and a fourth light-emitting unit 400. Each of the first light-emitting unit 100, the second light-emitting unit 200, the third light-emitting unit 300, and the fourth light-emitting unit 400 includes a first electrode 500, a second electrode 600, and an organic laminated body placed between the first electrode 500 and the second electrode 600 so as to create a stack. One of the first electrode 500 and the second electrode 600 is a translucent electrode, so that light can shoot from the translucent electrode out of the organic light-emitting structure.

Furthermore, an emission wavelength of the first light-emitting unit 100, an emission wavelength of the second light-emitting unit 200, an emission wavelength of the third light-emitting unit 300, and an emission wavelength of the fourth light-emitting unit 400 successively increase, that is to say, the emission wavelength of the second light-emitting unit 200 is greater than the emission wavelength of the first light-emitting unit 100, the emission wavelength of the third light-emitting unit 300 is greater than the emission wavelength of the second light-emitting unit 200, and the emission wavelength of the fourth light-emitting unit 400 is greater than the emission wavelength of the third light-emitting unit 300. In addition, each of a luminous efficiency of the second light-emitting unit 200 and a luminous efficiency of the third light-emitting unit 300 is greater than each of a luminous efficiency of the first light-emitting unit 100 and a luminous efficiency of the fourth light-emitting unit 400.

Conventional organic light-emitting structure uses three primary colors of RGB. In the natural colors that human eyes can recognize, yellow takes up a great part, and yellow is extracted from spectra of the convention RGB of red, green, and blue. However, in the present disclosure, the organic light-emitting structure includes the above-mentioned four light-emitting units. One of the above-mentioned four light-emitting units can emit yellow light independently, so that a color degree of yellow can be purer, for enlarging the color gamut. In addition, such configuration can improve blue color in a certain degree and enlarge the color gamut range of the organic light-emitting structure, thereby improving the color richness, the color saturation, and the color quantity of the light-emitting device, so that the development trend of color reproducibility of the display device is better satisfied, and basic performances of the display device can be improved.

Since human eyes are more sensitive to light with wavelength of 555 nm, and the visual sensitivity thereto is relatively high, and wavelengths of green light and yellow light are close to 555 nm, so that luminous efficiencies of green light and yellow light are relatively high; however, visual sensitivities to blue light and red light are relatively low, and compared with luminous efficiencies of green light and yellow light, luminous efficiencies of blue light and red light are relatively low. Therefore, the first light-emitting unit 100 is a blue-light emitting unit, a second light-emitting unit 200 is a green-light emitting unit, a third light-emitting unit 300 is a yellow-light emitting unit, and a fourth light-emitting unit 400 is a red-light emitting unit. Thus, when the emission wavelength of the first light-emitting unit 100, the emission wavelength of the second light-emitting unit 200, the emission wavelength of the third light-emitting unit 300, and the emission wavelength of the fourth light-emitting unit 400 successively increase, each of the luminous efficiency of the second light-emitting unit and the luminous efficiency of the third light-emitting unit is greater than each of the luminous efficiency of the first light-emitting unit and the luminous efficiency of the fourth light-emitting unit, so that the visual sensitivity of human eyes will be relatively high, and the image quality of the display device can be further improved. That is to say, the organic light-emitting structure can emit light by various combinations of blue light, green light, yellow light, and red light, and when the organic light-emitting structure is applied in the display device, by the various combinations of blue light, green light, yellow light, and red light, various colors can be displayed better, which makes colors are richer.

Typically, the organic light-emitting structure further includes a substrate 800. The substrate 800 can be a glass substrate. The first electrode 500, the organic laminated body, and the second electrode 600 of each of the first light-emitting unit 100, the second light-emitting unit 200, the third light-emitting unit 300, and the fourth light-emitting unit 400 are successively placed on one side of the substrate 800. That is, in each of the first light-emitting unit 100, the second light-emitting unit 200, the third light-emitting unit 300, and the fourth light-emitting unit 400, the organic laminated body is placed on the first electrode 500, and the second electrode 600 is placed on a surface of the organic laminated body away from the first electrode 500.

The above-described organic light-emitting structure can be in a top emission mode or in a bottom emission mode. In the bottom emission mode, a first electrode 500, as an anode, is formed on the substrate 800 and is a translucent electrode. The organic laminated body is formed on one side of the first electrode 500 away from the substrate 800, and finally the second electrode 600 is formed on one side of the organic laminated body away from the first electrode 500; the second electrode 600 is used as a cathode and is a non-transparent electrode; and light is extracted from one side of the anode (the first electrode 500) in the organic light-emitting unit. In the top emission mode, the first electrode 500, also as an anode, is formed on the substrate 800, then the organic laminated body is formed on one side of the first electrode 500 away from the substrate 800, and finally the second electrode 600 is formed on one side of the organic laminated body away from the first electrode 500; the second electrode 600 is a translucent electrode; and light is extracted from one side of the second electrode 600 in the organic light-emitting unit.

It should be noted that, in the top emission mode, for improving the luminous efficiency of the organic light-emitting structure, the organic light-emitting structure further includes a reflection film. The reflection film is placed between the first electrode 500 and the substrate 800, to reflect light which is emitted from the organic laminated body to the substrate 800 to the second electrode 600, and then the reflected light shoots out of the organic light-emitting structure through the second electrode 600. If the reflectivity of the reflection film is small, the luminous efficiency of the organic light-emitting structure decreases. Considering that wavelength of visible light to which human eyes are sensitive is close to 500 nm, preferably, the reflectivity of the reflection film to light with wavelength of 500 nm is greater than or equal to 70%, such as 70%, 75%, 80%, 85%, 88%, 90%, etc. Thus, sufficient light can be emitted out through the second electrode 600 by reflection, and the entire luminous efficiency of the organic light-emitting structure is ensured. A material of the reflection film can be silver alloy, and the reflection film can be made by a sputtering method using a silver target material. The reflectivity of the reflection film made of silver alloy to light with wavelength of 500 nm can reach 85%. It should be noted that, light reflected by the reflection film shoots out of the light-emitting unit through the first electrode 500, the organic laminated body, and the second electrode 600, so that a surface of the reflection film away from the substrate 800 is a working surface, also called a reflection surface. For reducing blockage to light transmission, the reflection film and the first electrode 500 share one interface, the reflection film and the substrate 800 may share one interface or may not share one interface, for example, a thin film transistor can be placed between the reflection film and the substrate 800.

No matter which mode the organic light-emitting structure is in, since one of the first electrode 500 and the second electrode 600 is a translucent electrode, transmission and reflection may happen to light in the translucent electrode, and then light interference may occur inside the light-emitting unit to form a microcavity effect. Thus, by adjusting thicknesses of each layer in the organic laminated body, intensity of light out of the light-emitting unit can be maximized.

In the top emission mode, because of the reflection film, light emitted from the organic laminated body respectively goes to the reflection film and the translucent electrode, and light going to the reflection film may be reflected to the translucent electrode; one part of light going to the translucent electrode may pass through the translucent electrode to outside, and the other part of light going to the translucent electrode may be reflected by the surface of the translucent electrode to the reflection film; and those three parts of light may interfere inside each light-emitting unit (such as the first light-emitting unit 100, the second light-emitting unit 200, the third light-emitting unit 300, and the fourth light-emitting unit 400), so that the microcavity effect can be fully used in the organic light-emitting structure to improve the luminous efficiency. Therefore, preferably, the organic light-emitting structure adopts the top emission mode. In the above-described embodiments, each of the first light-emitting unit 100, the second light-emitting unit 200, the third light-emitting unit 300, and the fourth light-emitting unit 400 can be a fluorescent light-emitting unit or a phosphorescent light-emitting unit.

A luminous brightness of the phosphorescent light-emitting unit is relatively high, and the luminous efficiency and luminous brightness of the phosphorescent light-emitting unit for green light, yellow light, and red light are relatively high, so that the second light-emitting unit 200, the third light-emitting unit 300, and the fourth light-emitting unit 400 are all selected to be phosphorescent light-emitting units. However, among the phosphorescent materials, materials emitting blue light are few, even are hard to find, so that the first light-emitting unit 100 is a fluorescent light-emitting unit. By those configurations, not only the brightness of the organic light-emitting structure can be improved, but also it is easy to select materials. In addition, the first light-emitting unit 100 is a fluorescent light-emitting unit, and the luminous efficiency of the fluorescent light-emitting unit is lower than the luminous efficiency of the phosphorescent unit, so that the luminous efficiency of the first light-emitting unit 100 is lower than each of the luminous efficiency of the second light-emitting unit 200 and the luminous efficiency of the third light-emitting unit 200; the fourth light-emitting unit 400 is also a phosphorescent light-emitting unit, while the fourth light-emitting unit 400 is a red-light emitting unit, and a visibility of red light is lower than a visibility of either yellow light or green light, so that the luminous efficiency of the fourth light-emitting unit 400 is also lower than each of the luminous efficiency of the second light-emitting unit 200 and the luminous efficiency of the third light-emitting unit 300. The fluorescent light-emitting unit refers to a light-emitting unit in which materials of the light-emitting portion are fluorescent light-emitting materials; the fluorescent light-emitting unit can be made of condensation polycyclic aromatic materials. The phosphorescent light-emitting unit refers to a light-emitting unit in which materials of the light-emitting portion are phosphorescent light-emitting materials, and the phosphorescent light-emitting unit can be made of iridium compound.

When the first light-emitting unit 100 is a blue-light emitting unit, the second light-emitting unit 200 is a green-light emitting unit, the third light-emitting unit 300 is a yellow-light emitting unit, and the fourth light-emitting unit 400 is a red-light emitting unit, the organic light-emitting structure can display white light in the following methods:

A first method, the first light-emitting unit 100, the second light-emitting unit 200, and the fourth light-emitting unit 400 emit light at the same time, that is to say, the blue-light emitting unit, the green-light emitting unit, and the red-light emitting unit work at the same time, and then the organic light-emitting structure displays white light.

A second method, the first light-emitting unit 100 and the third light-emitting unit 300 emit light at the same time, that is to say, the blue-light emitting unit and the yellow-light emitting unit work at the same time, and then the organic light-emitting structure displays white light.

A third method, the first light-emitting unit 100, the second light-emitting unit 200, the third light-emitting unit 300, and the fourth light-emitting unit 400 emit light at the same time, that is to say, the first method and the second method are used at the same time. By combination of the two methods, white light is strengthened, brightness of white light that the organic light-emitting structure emits is greater, and the visual sensation of image is brighter.

It should be noted that, in the first method, a key for the organic light-emitting structure displaying white light is the green-light emitting unit; in the second method, a key for the organic light-emitting structure displaying white light is the yellow-light emitting unit; and the visual sensitivity of the green-light emitting unit and the yellow-light emitting unit is relatively excellent, so that the organic light-emitting structure looks brighter for human eyes. If the green-light emitting unit is adjacent to the yellow-light emitting unit, for example, according to an order of the first light-emitting unit 100, the second light-emitting unit 200, the third light-emitting unit 300, and the fourth light-emitting unit 400, or according to an order of the fourth light-emitting unit 400, the first light-emitting unit 100, the second light-emitting unit 200, and the third light-emitting unit 300, because of illusion of human eyes, only one bright point is generated; if the green-light emitting unit is spaced from the yellow-light emitting unit, that is to say, the green-light emitting unit and the yellow-light emitting unit are not adjacent to each other, and at least the blue-light emitting unit or at least the red-light emitting unit is placed between the green-light emitting unit and the yellow-light emitting unit, according to an order of the fourth light-emitting unit 400, the second light-emitting unit 200, the first light-emitting unit 100, and the third light-emitting unit 300 placed, or according to an order of the second light-emitting unit 200, the first light-emitting unit 100, the fourth light-emitting unit 400, and the third light-emitting unit 300 placed, then since the green-light emitting unit and the yellow-light emitting unit is spaced from each other by the blue-light emitting unit or by the blue-light emitting unit and the red-light emitting unit, it seems there are two bright points for human eyes. If such arrangement is used in a process for making a full color display, a resolution of the organic light-emitting structure with such arrangement can be double a resolution of an organic light-emitting structure in which a green-light emitting unit is adjacent to a yellow-light emitting unit, which is certainly an illusion of human eyes and realizes an effect of simulating high resolution. Therefore, preferably, at least one of the first light-emitting unit 100 and the fourth light-emitting unit 400 is placed between the second light-emitting unit 200 and the third light-emitting unit 300, to make the green-light emitting unit and the yellow-light emitting unit spaced from each other and to improve a resolution sensed by human eyes.

Figure 2:
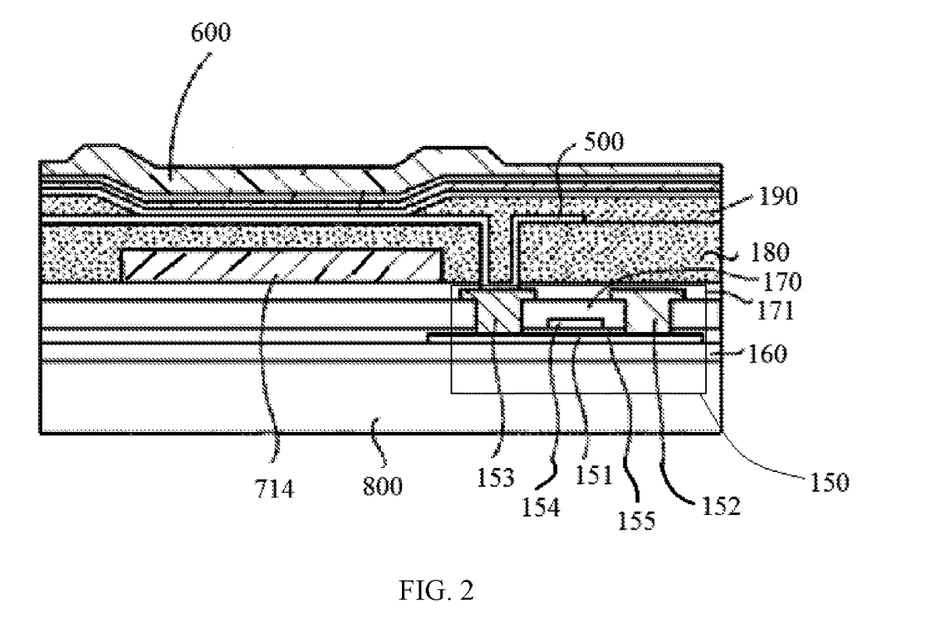
FIG. 2 illustrates a structural schematic diagram of another organic light-emitting structure according to an embodiment of the present disclosure.

In addition, each of the first light-emitting unit 100, the second light-emitting unit 200, the third light-emitting unit 300, and the fourth light-emitting unit 400 further includes a thin film transistor 150. The thin film transistor 150 is used for controlling light emitting of the first light-emitting unit 100, the second light-emitting unit 200, the third light-emitting unit 300, and the fourth light-emitting unit 400. By the thin film transistor 150, it facilitate to control each light-emitting unit and to realize different colors for the organic light-emitting structure. A material of the thin film transistor can be low temperature poly-silicon, amorphous silicon, or oxide semiconductor. The oxide semiconductor can be In—Ce—Zn, In—Y—Zn, In—Ga—Zn, In—Zr—Zn, In—La—Zn, In—Nd—Zn, or In—Ga. For example, as shown in FIG. 2, the thin film transistor 150 includes an active layer 151, a source electrode 152, a drain electrode 153, and a gate electrode 154. The source electrode 152 and the drain electrode 153 are electrically connected with the active layer 152. The gate electrode 154 is insulated from the active layer 151 by a first insulation film 155.

In the above-described structure, the organic laminated body includes a light-emitting portion. Optionally, a sum of an area of the light-emitting portion of the second light-emitting unit 200 and an area of the light-emitting portion of the third light-emitting unit 300 is smaller than a sum of an area of the light-emitting portion of the first light-emitting unit 100 and an area of the light-emitting portion of the fourth light-emitting unit 400, each of the area of the light-emitting portion of the second light-emitting unit 200 and the area of the light-emitting portion of the third light-emitting unit 300 can be smaller than each of the area of the light-emitting portion of the first light-emitting unit 100 and the area of the light-emitting portion of the fourth light-emitting unit 400, or one of the area of the light-emitting portion of the second light-emitting unit 200 and the area of the light-emitting portion of the third light-emitting unit 300 can be smaller than each of the area of the light-emitting portion of the first light-emitting unit 100 and the area of the light-emitting portion of the fourth light-emitting unit 400, the other one of the area of the light-emitting portion of the second light-emitting unit 200 and the area of the light-emitting portion of the third light-emitting unit 300 can be greater than each of the area of the light-emitting portion of the first light-emitting unit 100 and the area of the light-emitting portion of the fourth light-emitting unit 400, or in another combinations of areas. By those arrangement, a luminous area of the light-emitting unit with relatively high luminous efficiency is reduced, to make a light intensity thereof close to a light intensity of the light-emitting unit with relatively low luminous efficiency, which facilitates adjustment of white light for equilibrium. That is to say, by reducing the luminous area of the light-emitting unit with relatively high luminous efficiency and increasing the luminous area of the light-emitting unit with relatively low luminous efficiency, brightness of each light-emitting unit can be balanced to reach an objective brightness, so that brightness of each light-emitting unit can be controlled in a minimum limit, to reduce power consumption of the entire organic light-emitting structure. It can be understood that, the sum of the area of the light-emitting portion of the second light-emitting unit 200 and the area of the light-emitting portion of the third light-emitting unit 300 can be smaller than or equal to the sum of the area of the light-emitting portion of the first light-emitting unit 100 and the area of the light-emitting portion of the fourth light-emitting unit 400.

The organic laminated body can include one, two, or multiple film layer groups. When the organic laminated body includes multiple film layer groups, the multiple film layer groups are successively stacked up. By combinations of the multiple film layer groups, the luminous efficiency of each light-emitting unit is improved. Each film layer group may include a light-emitting layer, a hole injection layer, a hole transmission layer, and an electron transmission layer, etc. An exemplary structure is described in detail in the following embodiments.

Figure 3:
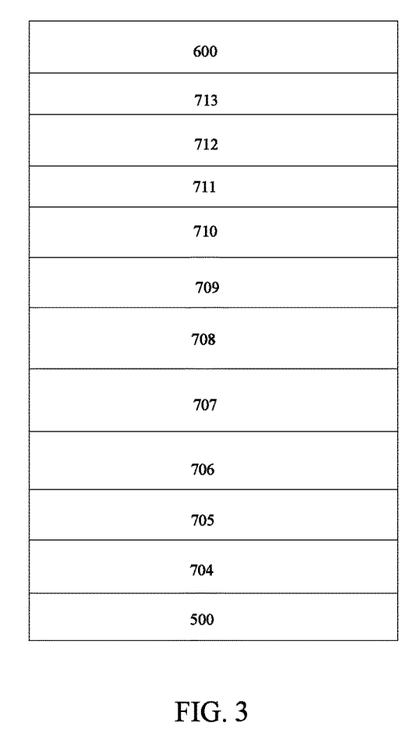
FIG. 3 illustrates a partial structural schematic diagram of still another organic light-emitting structure according to an embodiment of the present disclosure.

It is understood that, no matter which configuration the light-emitting portion is, the light-emitting portion can be a single film or multiple films, and the area of the light-emitting portion refers to an area of a projection of the light-emitting portion along a direction perpendicular to the substrate 800. For example, when the organic laminated body includes only one film layer group, the area of the light-emitting portion refers to an area of the light-emitting layer, as shown in FIG. 1. When the organic laminated body includes two film layer groups, as shown in FIG. 3, since along the direction perpendicular to the substrate 800, projections of the light-emitting layers of the two film layer groups completely overlap, the area of the light-emitting portion refers to an area of a single light-emitting layer.

In the above embodiments, the organic laminated body of the first light-emitting unit 100, the organic laminated body of the second light-emitting unit 200, the organic laminated body of the third light-emitting unit 300, the organic laminated body of the fourth light-emitting unit 400 can have a same configuration or can have different configurations. The organic light-emitting structure is described in details as follows for an example of the top emission mode.

Configurations of the organic laminated bodies of the light-emitting units are different from each other, as shown in FIG. 1, and the light-emitting layers of the organic laminated body emit light with different colors. The organic laminate body includes one organic film layer group. The organic film layer group includes a common hole injection layer 701, a hole transmission layer, a light-emitting layer, and a common electron transmission layer 703, and the a common hole injection layer 701, the hole transmission layer, the light-emitting layer, and the common electron transmission layer 703 are successively stacked. The common hole injection layer 701 is closer to the first electrode than the common electron transmission layer 703 is. That is to say, in any one of the first light-emitting unit 100, the second light-emitting unit 200, the third light-emitting unit 300, and the fourth light-emitting unit 400, the first electrode 500, the common hole injection layer 701, the common hole transmission 702, a monochromic hole transmission layer, the common electron transmission layer 703, and the second electrode 600 are successively stacked. Under such configuration, the light-emitting portion is the light-emitting layer, and generally, light of each light-emitting unit comes from the light-emitting layer of the organic laminated body. The light-emitting layer of the first light-emitting unit 100 is defined as a first light-emitting layer, the light-emitting layer of the second light-emitting unit 200 is defined as a second light-emitting layer, the light-emitting layer of the third light-emitting unit 300 is defined as a third light-emitting layer, and the light-emitting layer of the fourth light-emitting unit 400 is defined as a fourth light-emitting layer. One, two, three, or four of the first light-emitting layer, the second light-emitting layer, the third light-emitting layer, and the fourth light-emitting layer are made of fluorescent light-emitting material, and the rest of the first light-emitting layer, the second light-emitting layer, the third light-emitting layer, and the fourth light-emitting layer are made of phosphorescent light-emitting material. By setting that material of at least one light-emitting layer is fluorescent light-emitting material, kinds of materials of each light-emitting layer is richer, which facilitates selection of materials.

Furthermore, in the nature, the luminous efficiency of the phosphorescent materials is higher than the luminous efficiency of the fluorescent materials, so that at least one of the first light-emitting unit 100, the second light-emitting unit 200, the third light-emitting unit 300, and the fourth light-emitting unit 400 is the fluorescent light-emitting unit, each of the rest of the first light-emitting unit 100, the second light-emitting unit 200, and the third light-emitting unit 300, and the fourth light-emitting unit 400 is the phosphorescent light-emitting unit. That is to say, there is not only the fluorescent light-emitting unit but also the phosphorescent light-emitting unit in the first light-emitting unit 100, the second light-emitting unit 200, the third light-emitting unit 300, and the fourth light-emitting unit 400. For example, the first light-emitting unit 100 is the fluorescent light-emitting unit, and the second light-emitting unit 200, the third light-emitting unit 300, and the fourth light-emitting unit 400 are phosphorescent light-emitting units. That is to say, a material of the first light-emitting layer 101 is fluorescent light-emitting material, to make the first light-emitting unit 100 be the fluorescent light-emitting unit, and materials of the second light-emitting layer 201, the third light-emitting layer 301, and the fourth light-emitting layer 401 are phosphorescent light-emitting materials, to make the second light-emitting unit 200, the third light-emitting unit 300, and the fourth light-emitting unit 400 be phosphorescent light-emitting units. The effect of each light-emitting layer configured with the fluorescent light-emitting unit and the phosphorescent light-emitting unit has been described above, which will not be repeated herein.

To secure relations between the luminous efficiency of the light-emitting units and optimizing the microcavity effect, it is set that a thickness of the first light-emitting layer 101, a thickness of the second light-emitting layer 201, a thickness of the third light-emitting layer 301, and a thickness of the fourth light-emitting layer 401 successively increase (i.e., the thickness of the second light-emitting layer 201 is greater than the thickness of the first light-emitting layer 101, the thickness of the third light-emitting layer 301 is greater than the thickness of the second light-emitting layer 201, and the thickness of the fourth light-emitting layer 401 is greater than the thickness of the third light-emitting layer 301), and when the first light-emitting unit 100, the second light-emitting unit 200, the third light-emitting unit 300, and the fourth light-emitting unit 400 are successively placed along an extending direction of the substrate 800, as shown in FIG. 1, the thickness of the first light-emitting layer 101 is in a range of 18 nm-22 nm, such as 18 nm, 19 nm, 20 nm, 21 nm, and 22 nm; the thickness of the second light-emitting layer 201 is in a range of 31.5 nm-38.5 nm, such as 32.5 nm, 33 nm, 35 nm, 37 nm, 38 nm, and 38.5 nm; the thickness of the third light-emitting layer 301 is in a range of 31.5 nm-38.5 nm, such as 32.5 nm, 33 nm, 35 nm, 37 nm, 38 nm, and 38.5 nm; and the thickness of the fourth light-emitting layer 401 is in a range of 36 nm-44 nm, such as 36 nm, 38 nm, 40 nm, 42 nm, 43 nm, and 44 nm. By setting different thicknesses of the light-emitting layers of the light-emitting units, the optical path of light emitted from each light-emitting unit in the microcavity can be effectively controlled, so that the microcavity effect is optimized, thereby improving the luminous efficiency of each light-emitting unit.

As analyzed above, an interference effect occurs inside each light-emitting unit, so that the light intensity can be defined according to the optical path length (optical distance) in each light-emitting unit. When the light intensity increases, the optical distance increases, thus, when the wavelength increases, since light emitted from the first light-emitting unit 100, the second light-emitting unit 200, the third light-emitting unit 300, and the fourth light-emitting unit 400 has different wavelength, the thicknesses of the hole transmission layers of the light-emitting units are different, and adjustment of wavelength can be realized by adjusting the thickness of the monochromic hole transmission layer. Further, since emission wavelength of the first light-emitting unit 100, emission wavelength of the second light-emitting unit 200, emission wavelength of the third light-emitting unit 300, emission wavelength of the fourth light-emitting unit 400 successively, a thickness of the hole transmission layer of the first light-emitting unit 100, a thickness of the hole transmission layer of the second light-emitting unit 200, a thickness of the hole transmission layer of the third light-emitting unit 300, and a thickness of the hole transmission layer of the fourth light-emitting unit 100 successively increase. By adjusting thickness of each film layer in the organic laminated body, and adjusting the optical distance of light emitted from each light-emitting unit in the microcavity, wavelength of different light-emitting units can be better adapted, and the microcavity effect can be used optimally, thereby improving the luminous efficiency of the entire organic light-emitting structure.

The hole transmission layer of each light-emitting unit can only include a monochromic hole transmission layer, and under this situation, in each light-emitting unit, a thickness of the monochromic hole transmission layer is equal to a thickness of the hole transmission layer. The light-emitting layer may leak out electrons, the electrons may be immersed in the hole transmission layer contacting with them, and the higher the hole mobility of materials, the more easily the materials decompose, therefore, for reducing composition of the hole transmission layer as possible, the hole transmission layer of each light-emitting unit includes a monochromic hole transmission layer and a common hole transmission layer 702 stacked with the monochromic hole transmission layer. The common hole transmission layer 702 is further away from the light-emitting layer than the monochromic hole transmission layer is. As shown in FIG. 1, the material of the common hole transmission layer 702 is different from the material of the monochromic hole transmission layer. The organic laminated body of each of the first light-emitting unit 100, the second light-emitting unit 200, the third light-emitting unit 300, and the fourth light-emitting unit 400 includes the common hole transmission layer 702 and the monochromic hole transmission layer. Since the monochromic hole transmission layer is adjacent to the light-emitting layer, materials of all the common hole transmission layers 702 are the same and the commonly used hole transmission material, while materials of all the monochromic hole transmission layers are different from each other and are electron-resistant materials, for preventing electrons in the light-emitting layer from immersing into the monochromic hole transmission layer, then for preventing decomposition of the monochromic hole transmission layer, thereby prolonging the service life of the organic light-emitting structure. In addition, by such configuration, a thickness of the hole transmission layer of the organic laminated body can be increased, and charge carriers of each light-emitting unit can achieve equilibrium, for preventing bad structure, such as a structure with particles generated inside.

The monochromic hole transmission layer is used for transmitting holes for each light-emitting unit, to facilitate the light-emitting units to work. The light-emitting layer is closer to the translucent electrode than the monochromic hole transmission layer is. The monochromic hole transmission layer of the first light-emitting unit 100 can be defined as a first monochromic hole transmission layer 102; the monochromic hole transmission layer of the second light-emitting unit 200 can be defined as a second monochromic hole transmission layer 202; the monochromic hole transmission layer of the third light-emitting unit 300 can be defined as a third monochromic hole transmission layer 302; and the monochromic hole transmission layer of the fourth light-emitting unit 400 can be defined as a fourth monochromic hole transmission layer 402. The first monochromic hole transmission layer 102, the second monochromic hole transmission layer 202, the third monochromic hole transmission layer 302, and the fourth monochromic hole transmission layer 402 are separately prepared.

Under such configuration, a thicknesses of the common hole transmission layers 702 are the same, and a thickness of the first monochromic hole transmission layer 102, a thickness of the second monochromic hole transmission layer 202, a thickness of the third monochromic hole transmission layer 302, and a thickness of the fourth monochromic hole transmission layer 402 successively increase, to further adjust the optical distance in the microcavity by adjusting the thicknesses of the monochromic hole transmission layers, thereby better using the microcavity effect. A thickness difference value between any two adjacent monochromic hole transmission layers can be the same or different. As shown in FIG. 1, the thickness of the first monochromic hole transmission layer 102 is 10 nm, the thickness of the second monochromic hole transmission layer 202 is 30 nm, the thickness of the third monochromic hole transmission layer 302 is 50 nm, the thickness of the fourth monochromic hole transmission layer 402 is 70 nm, and the thickness difference value between any two adjacent monochromic hole transmission layers is 20 nm. Certainly, the thickness of the first monochromic hole transmission layer 102, the thickness of the second monochromic hole transmission layer 202, the thickness of the third monochromic hole transmission layer 302, and the thickness of the fourth monochromic hole transmission layer 402 can be other values. As shown in FIG. 1, the common monochromic hole transmission layers 702 can be prepared integrally to form one film layer, and that is to say, the common hole transmission layers 702 of all the light-emitting units are made of a same material.

Accordingly, for optimizing the microcavity effect, each of the first monochromic transmission layer 102, the second monochromic transmission layer 202, the third monochromic transmission layer 302, and the third monochromic transmission layer 402 has its own optimal thickness. Optionally, the thickness of the first monochromic transmission layer 102 is in a range of 9 nm-11 nm, such as 9 nm, 10 nm, 10.5 nm, and 11 nm; the thickness of the second monochromic transmission layer 202 is in a range of 27 nm-33 nm, such as 27 nm, 29 nm, 30 nm, 32 nm, 32.5 nm, and 33 nm; the thickness of the third monochromic transmission layer 302 is in a range of 45 nm-55 nm, such as 45 nm, 48 nm, 50 nm, 53 nm, 54.5 nm, and 55 nm; and the thickness of the fourth monochromic transmission layer 402 is in a range of 63 nm-77 nm, such as 63 nm, 66 nm, 69 nm, 70 nm, 73 nm, 75 nm, and 77 nm. By those arrangements, the microcavity effect can be optimized, and the luminous intensity can be maximized, so as to provide better luminous efficiency. Optionally, the thickness of the common hole transmission layer 702 is in a range of 117 nm-143 nm; the thickness of the common hole injection layer 701 is in a range of 9 nm-11 nm, such as 9 nm, 10 nm, and 11 nm; and the thickness of the common electron transmission layer 703 is in a range of 31.5 nm-38.5 nm, such as 31.5 nm, 33 nm, 35 nm, 37 nm, and 38.5 nm. Furthermore, the thickness of the first electrode 500 is in a range of 9 nm-11 nm, such as 9 nm, 10 nm, and 11 nm; and the thickness of the second electrode 600 is in a range of 12.6 nm-15.4 nm, such as 12.6 nm, 13 nm, 14 nm, 15 nm, and 15.4 nm.

The organic laminated body can include two or multiple organic film layer groups.

In the embodiment, the common film layers of the first light-emitting unit 100, the second light-emitting unit 200, the third light-emitting unit 300, and the fourth light-emitting unit 400, such as the first electrode 500, the second electrode 600, the common hole injection layer 701, the common hole transmission layer 702, and the common electron transmission layer 703, are common layers for the four light-emitting units, and can be prepared together; and different layers, such as the monochromic hole transmission layer and the light-emitting layer, can be separately prepared.

When the first light-emitting unit 100 is the blue-light emitting unit, the second light-emitting unit 200 is the green-light emitting unit, the third light-emitting unit 300 is the yellow-light emitting unit, and the fourth light-emitting unit 400 is the red-light emitting unit, that is to say, when the material of the first light-emitting layer 101 is a blue-light emitting material, the material of the second light-emitting layer 201 is a green-light emitting material, the material of the third light-emitting layer 301 is a yellow-light emitting material, and the material of the fourth light-emitting layer 401 is a red-light emitting material, the material of the second light-emitting layer 201 is a phosphorescent light-emitting material that emits green light, the material of the third light-emitting layer 301 is a phosphorescent light-emitting material that emits yellow light, and the material of the fourth light-emitting layer 401 is a phosphorescent light-emitting material that emits green red.

The material of the light-emitting layer of the phosphorescent light-emitting unit can be iridium compound or platinum compound. Furthermore, in a field of from green light to yellow light, there are a lot of highly efficient, and stable materials of iridium compounds, which have relatively high luminous efficiency in green light and yellow light. Therefore, each of the materials of the second light-emitting layer 201 and the third light-emitting layer 301 can include iridium compound, for further improving the efficiency and brightness of the organic light-emitting structure and realizing low power consumption of the display device at the same time.

The organic light-emitting structure of the present embodiment can be prepared by a coating method. The common layers of the first light-emitting unit 100, the second light-emitting unit 200, the third light-emitting unit 300, and the fourth light-emitting unit 400, such as the substrate 800, the first electrode 500, the reflection film (in the top emission mode), the common hole injection layer 701, the common hole transmission layer 702, the common electron transmission layer 703, the second electrode 600, and the light extraction layer 900, can be directly prepared by the coating method, for example, by a integral evaporation method using a common material. Different layers, such as the first light-emitting layer 101, the second light-emitting layer 201, the third light-emitting layer 301, the fourth light-emitting layer 401, the first monochromic hole transmission layer 102, the second monochromic hole transmission layer 202, the third monochromic hole transmission layer 302, and the fourth monochromic hole transmission layer 402, can be prepared by fine mask, and openings are defined in the fine mask respectively corresponding to different layers of each light-emitting unit. A detailed preparation process is as follows:

First, the substrate 800 is prepared. The substrate 800 can be a glass substrate. The thin film transistor can be directly formed on the substrate 800. The material of the thin film transistor can be low temperature poly-silicon, amorphous silicon, or oxide semiconductor. The oxide semiconductor can be In—Ce—Zn, In—Y—Zn, In—Ga—Zn, In—Zr—Zn, In—La—Zn, In—Nd—Zn, or In—Ga.

Pixels can be formed on the thin film transistor of the substrate in advance. Four sub-pixels forms one pixel. The four sub-pixels one-to-one correspond to the first light-emitting unit 100, the second light-emitting unit 200, the third light-emitting unit 300, and the fourth light-emitting unit 400, respectively. The four sub-pixels are independent from each other, and are driven by controlling the thin film transistor. The reflection film with a thickness of 100 nm is formed on the sub-pixels by a sputtering method using a silver target material. The first electrode 500 with a thickness of 10 nm is formed on the reflection film, and the reflection film is an oxide film. The reflection film can also be made of silver alloy.

On the first electrode 500, the organic laminated body is prepared by a vacuum evaporation method. The common layers are prepared by an integral evaporation method using a same material. Different layers are prepared by using fine mask. Different layers in each of the first light-emitting unit 100, the second light-emitting unit 200, the third light-emitting unit 300, and the fourth light-emitting unit 400 are separately formed by evaporation method using different materials. At the same time, openings are defined in the fine mask respectively corresponding to the sub-pixels in the first light-emitting unit 100, the second light-emitting unit 200, the third light-emitting unit 300, and the fourth light-emitting unit 400. Through the openings, the different layers are formed by selective evaporation of needed material for each light-emitting unit. Detailed operations are as follows:

Compound I as the material of the common hole injection layer 701 is evaporated with a thickness of 10 nm. Then, Compound II as the material of the common hole transmission layer 702 is evaporated with a thickness of 130 nm.

Next, the microcavity is prepared by different materials. In the blue-light emitting unit, Compound III as the material of the blue-light hole transmission layer is evaporated with a thickness of 10 nm, to form the first monochromic hole transmission layer 102; in the green-light emitting unit, Compound IV as the material of the green-light hole transmission layer is evaporated with a thickness of 30 nm, to form the second monochromic hole transmission layer 202; in the yellow-light emitting unit, Compound IV as the material of the yellow-light hole transmission layer is evaporated with a thickness of 50 nm, to form the third monochromic hole transmission layer 302; and in the red-light emitting unit, a Compound IV as the material of the red-light hole transmission layer is evaporated with a thickness of 70 nm, to form the fourth monochromic hole transmission layer 402.

After that, on the above-described film layers, the first light-emitting layer 101, the second light-emitting layer 201, the third light-emitting layer 301, and the fourth light-emitting layer 401 are separately prepared by using fine mask. In the blue-light emitting unit, Compound V as a host and Compound VI as a blue light dopant are evaporated together, to form the first light-emitting layer 101 with a thickness of 20 nm; in the green-light emitting unit, Compound VII as a host and Compound VIII as a green light dopant are evaporated together, to form the second light-emitting layer 201 with a thickness of 35 nm; in the yellow-light emitting unit, Compound IX as a host and Compound X as a yellow light dopant are evaporated together, to form the third light-emitting layer 301 with a thickness of 35 nm; and in the red-light emitting unit, Compound XI as a host and Compound XII as a red light dopant are evaporated together, to form the fourth light-emitting layer 401 with a thickness of 40 nm.

Then, the common electron transmission layer 703 is prepared on each light-emitting layer. Compound XIII and a Compound XIV are evaporated together with a ratio of 1:1, to form the common electron transmission layer 703 with a thickness of 35 nm.

Following that, the translucent cathode with a thickness of 14 nm is deposited on the common electron transmission layer 703 using Mg and Ag (with a ratio of 10:1), to form the second electrode 600. Measuring the translucent cathode, the transmittance of the translucent cathode is 35%. If the transmittance of the translucent cathode is relatively low, the luminous efficiency decreases, however, for maintaining the efficiency of the entire organic light-emitting structure, preferably, the transmittance of the translucent cathode is greater than or equal to 20%.

On the second electrode 600, the light extraction layer 900 can be prepared. Compound XV is evaporated to prepare a common organic layer (also referred to as light exaction layer 900) for optical adjustment, with a thickness of 60 nm. The refractive index of the common organic layer for optical adjustment on wavelength of 500 nm is 1.85. Since, the luminous intensity, brightness and efficiency are adjusted by adjusting light interference in the microcavity, the refractive index of the organic laminated body may be limited, while the refractive index of the light extraction layer 900 can be greater than the refractive index of the organic laminated body, so that the brightness of light emitted from the light-emitting units becomes greater, especially effect in the blue-light emitting unit is more obvious, and the brightness with the light extraction layer 900 is 10% greater than a brightness without the light extraction layer 900.

Finally, in a dried nitrogen environment, the organic light-emitting structure is covered by a selected packaging glass, and packaged by a Frit method (by a laser welding method using glass powders), to finish preparation of the entire panel. Though the organic light-emitting structure can be packaged by UV-curable resin, a better packaging effect can be obtained by the laser welding method using glass powders.

Parameters of the organic light-emitting structure prepared by the above-described process are shown in Table 1. In Table 1, Blue refers to the first light-emitting unit 100, Green refers to the second light-emitting unit 200, Yellow refers to the third light-emitting unit 300, Red refers to the fourth light-emitting unit 400, and CIE refers to coherent infrared energy.

TABLE 1

| | Efficiency (cd/A) | Voltage (V) | CIE | Peak of wavelength (nm) |
|---|---|---|---|---|
| Blue | 4 | 3.9 | 0.13, 0.05 | 463 |
| Green | 80 | 4.1 | 0.24, 0.74 | 523 |
| Yellow | 75 | 4.1 | 0.48, 0.53 | 561 |
| Red | 23 | 4.3 | 0.66, 0.33 | 616 |

As shown in Table 1, using the organic light-emitting structure of the present disclosure, in which the material of the first light-emitting layer 101 is the fluorescent light-emitting material, and the materials of the second light-emitting layer 201, the third light-emitting layer 301, and the fourth light-emitting layer 401 are phosphorescent light-emitting materials, the visual sensitivity of green light and yellow light are better. The luminous efficiency of each light-emitting unit can be effectively guaranteed. At the same time, by combinations of the four kinds of light-emitting units, picture colors are brighter, and picture quality is better.

It is also demonstrated that, in the organic light-emitting structure, for achieving a better white equilibrium, a relation between the luminous areas of the light-emitting units is determined by magnitude of the luminous efficiency. That is to say, a light-emitting unit with a relatively great luminous efficiency can achieve a great brightness by reducing the area. However, a light-emitting unit with a relatively low luminous efficiency can't achieve a great brightness by enlarging the area. On the contrary, enlarging the luminous area of the light-emitting unit with a relatively great luminous efficiency, and reducing the luminous area of the light-emitting unit with a relatively low luminous efficiency, if a great current is not used to drive the light-emitting unit with a relatively low luminous efficiency to emit light, the better white equilibrium can't be achieved, which may result in disadvantages, such as increase of power consumption, and short luminescence lifetime. Therefore, the luminous area of the light-emitting unit with a relatively great luminous efficiency is set to be relatively small, for enlarging the luminous area of the light-emitting unit with a relatively low luminous efficiency, a sum of an area of the light-emitting portion of the second light-emitting unit 200 and an area of the light-emitting portion of the third light-emitting unit 300 must be smaller than a sum of an area of the light-emitting portion of the first light-emitting unit 100 and an area of the light-emitting portion of the fourth light-emitting unit 400. Thus, in case of adjusting required color by four colors, the better white equilibrium can be achieved, and at the same time, disadvantages, such as increase of power consumption and decrease of lifetime, will not be caused.

Optionally, configurations of the organic laminated bodies are the same, that is to say, the organic laminated body of the first light-emitting unit 100, the organic laminated body of the second light-emitting unit 200, the organic laminated body of the third light-emitting unit 300, and the organic laminated body of the fourth light-emitting unit 400 have the same configuration. The organic laminated body of the first light-emitting unit 100, the organic laminated body of the second light-emitting unit 200, the organic laminated body of the third light-emitting unit 300, and the organic laminated body of the fourth light-emitting unit 400 are organic laminated bodies emitting white light. Each organic laminated body includes a light-emitting layer, and each light-emitting layer is a white-light emitting layer.

Each organic laminated body includes a hole injection layer 704, a first hole transmission layer 705, a blue-light emitting layer 706, a first electron transmission layer 707, an N-type charge generation layer 708, a P-type charge generation layer 709, a second hole transmission layer 710, a yellow-light emitting layer 711, a second electron transmission layer 712, and an electron injection layer 713. The hole injection layer 704 is closer to the first electrode 500 than the electron injection layer 713 is. By those configuration, a blue OLED and a yellow OLED are formed. By combination of the blue OLED and the yellow OLED, white light is finally emitted, so that each organic laminated body emits white light. In addition, in a serial structure, the N-type charge generation layer 708 and the P-type charge generation layer 709 are added to provide electrons and holes for both the blue OLED and the yellow OLED. In the structure with the hole injection layer 704, the first hole transmission layer 705, the blue-light emitting layer 706, the first electron transmission layer 707, the N-type charge generation layer 708, the P-type charge generation layer 709, the second hole transmission layer 710, the yellow-light emitting layer 711, the second electron transmission layer 712, and the electron injection layer 713, electrons are provided on one side of the blue OLED, holes are provided on one side of the yellow OLED, so that a problem of insufficient charge injection is solved, while keeping a relatively great luminous efficiency.

Optionally, a thickness of the hole injection layer 704 is in a range of 45 nm-55 nm, such as 45 nm, 48 nm, 50 nm, 53 nm, and 55 nm; a thickness of the first hole transmission layer 705 is in a range of 18 nm-22 nm, such as 18 nm, 19 nm, 20 nm, 21 nm, and 22 nm; a thickness of the blue-light emitting layer 706 is in a range of 27 nm-33 nm, such as 27 nm, 29 nm, 30 nm, 32 nm, and 33 nm; a thickness of the first electron transmission layer 707 is in a range of 13.5 nm-16.5 nm, such as 13.5 nm, 15 nm, and 16.5 nm; a thickness of the N-type charge generation layer 708 is in a range of 0.18 nm-0.22 nm, such as 0.18 nm, 0.2 nm, and 0.22 nm; a thickness of the P-type charge generation layer 709 is in a range of 54 nm-66 nm, such as 54 nm, 57 nm, 60 nm, 65 nm, and 66 nm; a thickness of the second hole transmission layer 710 is in a range of 18 nm-22 nm, such as 18 nm, 20 nm, and 22 nm; a thickness of the yellow-light emitting layer 711 is in a range of 27 nm-33 nm, such as 27 nm, 29 nm, 30 nm, 32 nm, and 33 nm; a thickness of the second electron transmission layer 712 is in a range of 13.5 nm-16.5 nm, such as 13.5 nm, 15 nm, 16.5 nm; a thickness of the electron injection layer 713 is in a range of 0.18 nm-0.22 nm, such as 0.18 nm, 0.2 nm, and 0.22 nm. Furthermore, in this case, a thickness of the first electrode 500 can be in a range of 72 nm-88 nm, such as 72 nm, 78 nm, 80 nm, 84 nm, 88 nm; a material of the second electrode 600 can be aluminum, and a thickness of the second electrode 600 can be in a range of 90 nm-110 nm, such as 90 nm, 95 nm, 100 nm, 105 nm, 110 nm.

In addition, in the present embodiment, the organic light-emitting structure is formed by combination of white light and a light filter. That is to say, each of the first light-emitting unit 100, the second light-emitting unit 200, the third light-emitting unit 300, and the fourth light-emitting unit 400 further includes a light filter 714. The light filter 714 is placed on one side of the translucent electrode away from the organic laminated body. Colors of the light filter 714 of the first light-emitting unit 100, the light filter 714 of the second light-emitting unit 200, the light filter 714 of the third light-emitting unit 300, and the light filter 714 of the fourth light-emitting unit 400 are different from each other. The light filter 714 of the first light-emitting unit 100 can be defined as a first light filter, the light filter 714 of the second light-emitting unit 200 can be defined as a second light filter, the light filter 714 of the third light-emitting unit 300 can be defined as a third light filter, and the light filter 714 of the fourth light-emitting unit 400 can be defined as a fourth light filter. Each of transmittance of the second light filter and transmittance of the third light filter is greater than each of transmittance of the first light filter and transmittance of the fourth light filter. In that way, by setting different transmittance of the light filters, the luminous intensity of each light-emitting unit is adjusted and then the luminous efficiency is adjusted. When the first light-emitting unit 100 is the blue-light emitting unit, the second light-emitting unit 200 is the green-light emitting unit, the third light-emitting unit 300 is the yellow-light emitting unit, and the fourth light-emitting unit 400 is the red-light emitting unit, the first light filter is a blue-light filter, the second light filter is a green-light filter, the third light filter is a yellow-light filter, and the fourth light filter is a red-light filter, so that in the first light-emitting unit 100, by combination of the organic laminated body and the first light filter, the first light-emitting unit 100 emits blue light; in the second light-emitting unit 200, by combination of the organic laminated body and the second light filter, the second light-emitting unit 200 emits green light; in the third light-emitting unit 300, by combination of the organic laminated body and the third light filter, the third light-emitting unit 300 emits yellow light; and in the fourth light-emitting unit 400, by combination of the organic laminated body and the fourth light filter, the fourth light-emitting unit 400 emits red light.

In that way, the light filter 714 is made by a wet process with a solvent, while a material of the first electrode is an organic material, if the light filter 714 is directly formed on the first electrode, a problem that the first electrode is dissolved by the solvent may happen, so that the first electrode 500 and the light filter 714 do not share interface, and the first electrode 500 and the light filter 714 are spaced from each other by an organic insulation film (e.g., a first planarization film 180 as shown in FIG. 2).

In the present embodiment, the organic light-emitting structure without a reflection film is shown in FIG. 2. The organic light-emitting structure includes a substrate 800. A thin film transistor 150 is placed on the substrate 800, and configuration of the thin film transistor 150 has already described as above, which won't be repeated herein. A second insulation film 160 is placed between the substrate 800 and the active layer 151. A third insulation film 170, a fourth insulation film 171, a first planarization film 180, and a second planarization film 190 are successively placed on one side of the thin film transistor 150 away from the substrate 800. The light filter 714 is placed between the first planarization film 180 and the fourth insulation film 171. The first electrode 500, the organic laminated body, and the second electrode 600 are successively placed on one side of the first planarization film 180 away from the light filter. Configuration of the organic laminated body refers to FIG. 3, and preparing process for the organic laminated body is illustrated as follows:

First, on the side of the first electrode 500 away from the substrate 800, Compound I is evaporated, to form the hole injection layer 704 with a thickness of 50 nm. Then, Compound II is evaporated to form the first hole transmission layer 705 with a thickness of 20 nm.

Next, on the first hole transmission layer 705, Compound V as a host and Compound XVI as a phosphorescent blue light dopant are evaporated together, to form the blue-light emitting layer 706 with a thickness of 30 nm, in which a content of the phosphorescent blue light dopant is 5%.

Then, on the blue-light emitting layer 706, Compound XVII is evaporated to form the first electron transmission layer 707 with a thickness of 15 nm; similarly, lithium oxide is evaporated to form the N-type charge generation layer 708 with a thickness of 0.2 nm; Compound I is evaporated to form the P-type charge generation layer 709 (p-CGL) with a thickness of 60 nm; and Compound II is evaporated to form the second hole transmission layer 710 with a thickness of 20 nm.

Then, Compound IX as a yellow light host and Compound XVIII as a phosphorescent yellow light dopant are mixed together, to form the yellow-light emitting layer 711 with a thickness of 30 nm, in which a content of the phosphorescent yellow light dopant is 6%. Then, on the yellow-light emitting layer 711, the second electron transmission layer 712 with a thickness of 15 nm is formed by Compound XVII.

Finally, the second electrode 600 with a thickness of 100 nm is formed by aluminum.

In the process described as above, the first electrode 500 is an anode, and the second electrode 600 is a cathode, to form the organic light-emitting structure in the bottom emission mode.

When the organic light-emitting structure is applied with a current of 10 mA/cm$^2$ and a driving voltage of 8.9V, a warm white color light with a luminous efficiency of 40.2 cd/A is achieved.

Molecular formulas of Compound I to Compound XVIII are as follows:

Compound I

Compound II

Compound III

Compound IV

Compound V

Compound VI

Compound VII

Compound VIII

Compound IX

Compound X

Compound XI

Compound XII

Compound XIII

Compound XIV

Compound XV

Compound XVI

Compound XVII

Compound XVIII

In the above-described structures, the first embodiment is prepared by the coating method, and the organic light-emitting structure formed can use the microcavity effect to improve the luminous efficiency of each light-emitting unit. In addition, in the first embodiment, colors of the light-emitting units display independently, so that a purity of each color can be improved, and color reproducibility of NTSC can reach 100%. The second embodiment uses a combination of white light and the light filter, a fine mask process is not required, and the making process is simple.

In addition, the present disclosure further provides a display device including any one of the organic light-emitting structures as described-above.

Embodiments described above are merely examples, which are not intended to limit the present disclosure. Any modification, equivalent replacement, and improvement made within the spirit and principle of the present disclosure shall fall into the scope of the present disclosure.

What is claimed is:

1. An organic light-emitting structure, comprising:
a first light-emitting unit,
a second light-emitting unit,
a third light-emitting unit, and
a fourth light-emitting unit,
wherein each of the first light-emitting unit, the second light-emitting unit, the third light-emitting unit, and the fourth light-emitting unit comprises a first electrode, a second electrode, and an organic laminated body placed between the first electrode and the second electrode, and one of the first electrode and the second electrode is a translucent electrode;
an emission wavelength of the first light-emitting unit, an emission wavelength of the second light-emitting unit, an emission wavelength of the third light-emitting unit, and an emission wavelength of the fourth light-emitting unit successively increase; and each of a luminous efficiency of the second light-emitting unit and a luminous efficiency of the third light-emitting unit is greater than each of a luminous efficiency of the first light-emitting unit and a luminous efficiency of the fourth light-emitting unit, wherein the organic laminated body comprises a common hole injection layer, a common hole transmission layer, a monochromic hole transmission layer, a light-emitting layer, and a common electron transmission layer; the common hole injection layer, the common hole transmission layer, the monochromic hole transmission layer, the light-emitting layer, and the common electron transmission layer are successively stacked; and the common hole injection layer is closer to the first electrode than the common electron transmission layer;

wherein the monochromic hole transmission layer of the first light-emitting unit is a first monochromic hole transmission layer; the monochromic hole transmission layer of the second light-emitting unit is a second monochromic hole transmission layer; the monochromic hole transmission layer of the third light-emitting unit is a third monochromic hole transmission layer; the monochromic hole transmission layer of the fourth light-emitting unit is a fourth monochromic hole transmission layer; and wherein a thickness of the first monochromic hole transmission layer, a thickness of the second monochromic hole transmission layer, a thickness of the third monochromic hole transmission layer, and a thickness of the fourth monochromic hole transmission layer successively increase.

2. The organic light-emitting structure according to claim 1, a sum of an area of the light-emitting layer of the second light-emitting unit and an area of the light-emitting layer of the third light-emitting unit is smaller than a sum of an area of the light-emitting layer of the first light-emitting unit and an area of the light-emitting layer of the fourth light-emitting unit.

3. The organic light-emitting structure according to claim 1, wherein the first light-emitting unit is a blue-light emitting unit; the second light-emitting unit is a green-light emitting unit; the third light-emitting unit is a yellow-light emitting unit; and the fourth light-emitting unit is a red-light emitting unit.

4. The organic light-emitting structure according to claim 3, wherein the first light-emitting unit is a fluorescent light-emitting unit; the second light-emitting unit, the third light-emitting unit, and the fourth light-emitting unit are phosphorescent light-emitting units.

5. The organic light-emitting structure according to claim 3, wherein the organic light-emitting structure emits white light by at least one of:
the first light-emitting unit, the second light-emitting unit, and the fourth light-emitting unit emitting light at the same time; and
the first light-emitting unit and the third light-emitting unit emitting light at the same time.

6. The organic light-emitting structure according to claim 3, wherein at least one of the first light-emitting unit and the fourth light-emitting unit is placed between the second light-emitting unit and the third light-emitting unit.

7. The organic light-emitting structure according to claim 1, wherein each of the first light-emitting unit, the second light-emitting unit, the third light-emitting unit, and the fourth light-emitting unit further comprises a thin film transistor, the thin film transistor of the first light-emitting unit is used for controlling light emission of the first light-emitting unit, the thin film transistor of the second light-emitting unit is used for controlling light emission of the second light-emitting unit, the thin film transistor of the third light-emitting unit is used for controlling light emission of the third light-emitting unit, and the thin film transistor of the fourth light-emitting unit is used for controlling light emission of the fourth light-emitting unit.

8. The organic light-emitting structure according to claim 1, wherein each of the organic laminated body of the first light-emitting unit, the organic laminated body of the second light-emitting unit, the organic laminated body of the third light-emitting unit, and the organic laminated body of the fourth light-emitting unit is an organic laminated body for emitting white light;
each of the first light-emitting unit, the second light-emitting unit, the third light-emitting unit, and the fourth light-emitting unit further comprises a light filter, the light filter is placed on one side of the translucent electrode away from the organic laminated body, and colors of the light filter of the first light-emitting unit, the light filter of the second light-emitting unit, the light filter of the third light-emitting unit, and the light filter of the fourth light-emitting unit are different from each other.

9. The organic light-emitting structure according to claim 8, wherein the light filter of the first light-emitting unit is a first light filter, the light filter of the second light-emitting unit is a second light filter, the light filter of the third light-emitting unit is a third light filter, the light filter of the fourth light-emitting unit is a fourth light filter, each of a transmittance of the second light filter and a transmittance of the third light filter is greater than each of a transmittance of the first light filter and a transmittance of the fourth light filter.

10. The organic light-emitting structure according to claim 1, wherein the light-emitting layer of the first light-emitting unit is a first light-emitting layer; the light-emitting layer of the second light-emitting unit is a second light-emitting layer; the light-emitting layer of the third light-emitting unit is a third light-emitting layer; the light-emitting layer of the fourth light-emitting unit is a fourth light-emitting layer; and
a thickness of the first light-emitting layer is independently in a range of 18 nm-22 nm; a thickness of the second light-emitting layer is independently in a range of 31.5 nm-38.5 nm; a thickness of the third light-emitting layer is independently in a range of 31.5 nm-38.5 nm; and a thickness of the fourth light-emitting layer is independently in a range of 36 nm-44 nm.

11. A display device, comprising an organic light-emitting structure, wherein the organic light-emitting structure comprises:
a first light-emitting unit,
a second light-emitting unit,
a third light-emitting unit, and
a fourth light-emitting unit,
wherein each of the first light-emitting unit, the second light-emitting unit, the third light-emitting unit, and the fourth light-emitting unit comprises a first electrode, a second electrode, and an organic laminated body placed between the first electrode and the second electrode, and one of the first electrode and the second electrode is a translucent electrode;
an emission wavelength of the first light-emitting unit, an emission wavelength of the second light-emitting unit, an emission wavelength of the third light-emitting unit, and an emission wavelength of the fourth light-emitting unit successively increase; and each of a luminous efficiency of the second light-emitting unit and a luminous efficiency of the third light-emitting unit is greater than each of a luminous efficiency of the first light-emitting unit and a luminous efficiency of the fourth light-emitting unit, wherein the organic laminated body comprises a common hole injection layer, a common hole transmission layer, a monochromic hole transmission layer, a light-emitting layer, and a common electron transmission layer; the common hole injection layer, the common hole transmission layer, the monochromic hole transmission layer, the light-emitting layer, and the common electron transmission layer are successively stacked; and the common hole injection layer is closer to the first electrode than the common electron transmission layer;

wherein the monochromic hole transmission layer of the first light-emitting unit is a first monochromic hole transmission layer; the monochromic hole transmission layer of the second light-emitting unit is a second monochromic hole transmission layer; the monochromic hole transmission layer of the third light-emitting unit is a third monochromic hole transmission layer; the monochromic hole transmission layer of the fourth light-emitting unit is a fourth monochromic hole transmission layer; and wherein a thickness of the first monochromic hole transmission layer, a thickness of the second monochromic hole transmission layer, a thickness of the third monochromic hole transmission layer, and a thickness of the fourth monochromic hole transmission layer successively increase.

* * * * *